(12) United States Patent
Ghosh et al.

(10) Patent No.: US 8,456,946 B2
(45) Date of Patent: Jun. 4, 2013

(54) NAND LOGIC WORD LINE SELECTION

(75) Inventors: Swaroop Ghosh, Hillsboro, OR (US); Dinesh Somasekhar, Portland, OR (US); Balaji Srinivasan, Hillsboro, OR (US); Fatih Hamzaoglu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 185 days.

(21) Appl. No.: 12/928,949

(22) Filed: Dec. 22, 2010

(65) Prior Publication Data

US 2012/0163114 A1    Jun. 28, 2012

(51) Int. Cl.
*G11C 8/00*     (2006.01)

(52) U.S. Cl.
USPC ............. 365/230.06; 365/189.05; 365/189.08

(58) Field of Classification Search
USPC ............................. 365/230.06, 189.05, 189.08
See application file for complete search history.

(56) References Cited

U.S. PATENT DOCUMENTS

| | | | | | |
|---|---|---|---|---|---|
| 6,038,191 | A | * | 3/2000 | Fukuhara et al. | 365/229 |
| 6,108,245 | A | * | 8/2000 | Rha | 365/189.08 |
| 7,697,365 | B2 | * | 4/2010 | Tran et al. | 365/230.06 |

* cited by examiner

*Primary Examiner* — Son Dinh

(74) *Attorney, Agent, or Firm* — Blakely, Sokoloff, Taylor & Zafman LLP

(57) ABSTRACT

A NAND architecture for selecting a word line driver in a DRAM is disclosed. Separately decoded addresses in the low, mid and high ranges are used to select a final word line driver. The output of the word line driver is at a potential negative with respect to ground for a deselected word line and a positive potential more positive than the power supply potential for a selected word line.

20 Claims, 5 Drawing Sheets

NAND LOGIC WORD LINE SELECTION

FIELD OF THE INVENTION

The invention relates to the field of dynamic random access memories (DRAMs) and in particular to word line drivers in these memories.

BACKGROUND OF THE INVENTION

It has been recognized for many years that boosting potentials during active DRAM cycles can enhance reading and writing. See, U.S. Pat. Nos. 4,247,917; 4,087,704; and 4,584,672.

It is also known in DRAMs to level shift signals for a variety of reasons. An example of level shifting is shown in U.S. Pat. No. 4,460,257.

DETAILED DESCRIPTION

A word line (WL) driver and WL selection circuits for a dynamic random access memory (DRAM) is disclosed. In the following description, numerous specific details are set forth such as specific numbers of word lines and word line drivers, in order to provide a thorough understanding of the present invention. It will be obvious to one skilled in the art, that the present invention may be practiced without these specific details. In other instances, well-known circuits are not described in detail to avoid unnecessarily obscuring the present invention.

The DRAM described below is fabricated using complementary metal-oxide (CMOS) technology as a single integrated circuit using known processing technology.

Word Line Driver Signal

The described DRAM in one embodiment operates from a single potential of Vcc (e.g. 1 volt) referenced to ground (Vss). As will be seen, the driving signals on the WLs extend from a positive potential higher than Vcc (e.g. 1.5 volts) to a negative potential (e.g. 0.25 volts) with respect to Vss. There are on-chip charge pump circuits used to generate both the higher positive potential and the lower negative potential. Thus only a single potential is applied to the memory and the substrate on which the circuit is fabricated remains at Vss.

Figure 1B:
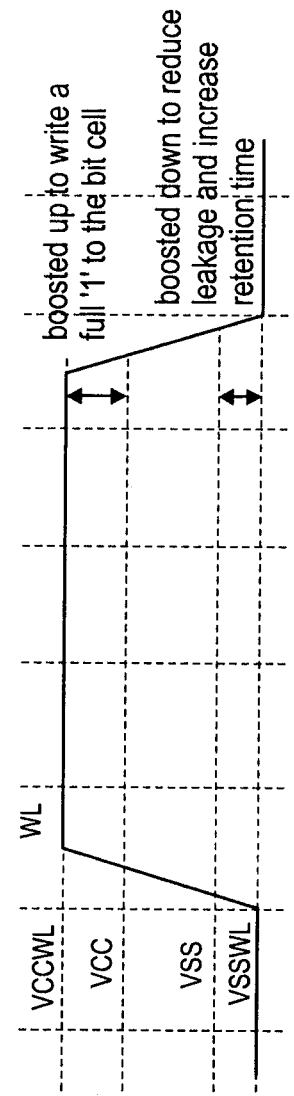
FIG. 1B is a waveform for a word line driver signal. As will be seen, this signal rises above Vcc and drops below Vss.
Figure 1A:
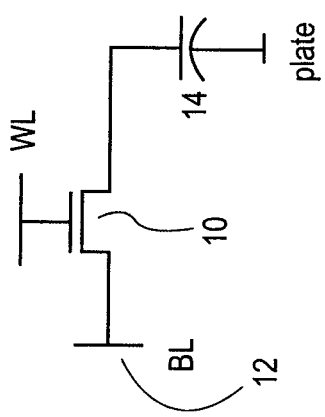
FIG. 1A is a schematic of a single cell in a DRAM.

Referring to FIG. 1A, a single DRAM cell is shown having a capacitor 14 with one of its terminals coupled to ground and the other coupled to the n-channel transistor 10. Transistor 10 selectively couples the capacitor 14 to a bit line 12. The waveform of the WL signal is shown in FIG. 1B. It extends from a negative potential (VssWL) with respect to Vss to a positive potential greater than Vcc (VccWL). VssWL reduces leakage through the transistor 10 and consequently increases the retention time of charge on the capacitor 14. The more positive VccWL potential assures that there will be no threshold drop across transistor 10 and thus during writing, capacitor 14 can be charged to a full Vcc potential. Without protecting circuits, switching and transferring the higher positive voltage with ordinary transistors used in CMOS circuits increases leakage as well as defect rates. As will be seen, higher voltage protection is included in the circuits described below.

Figure 2:
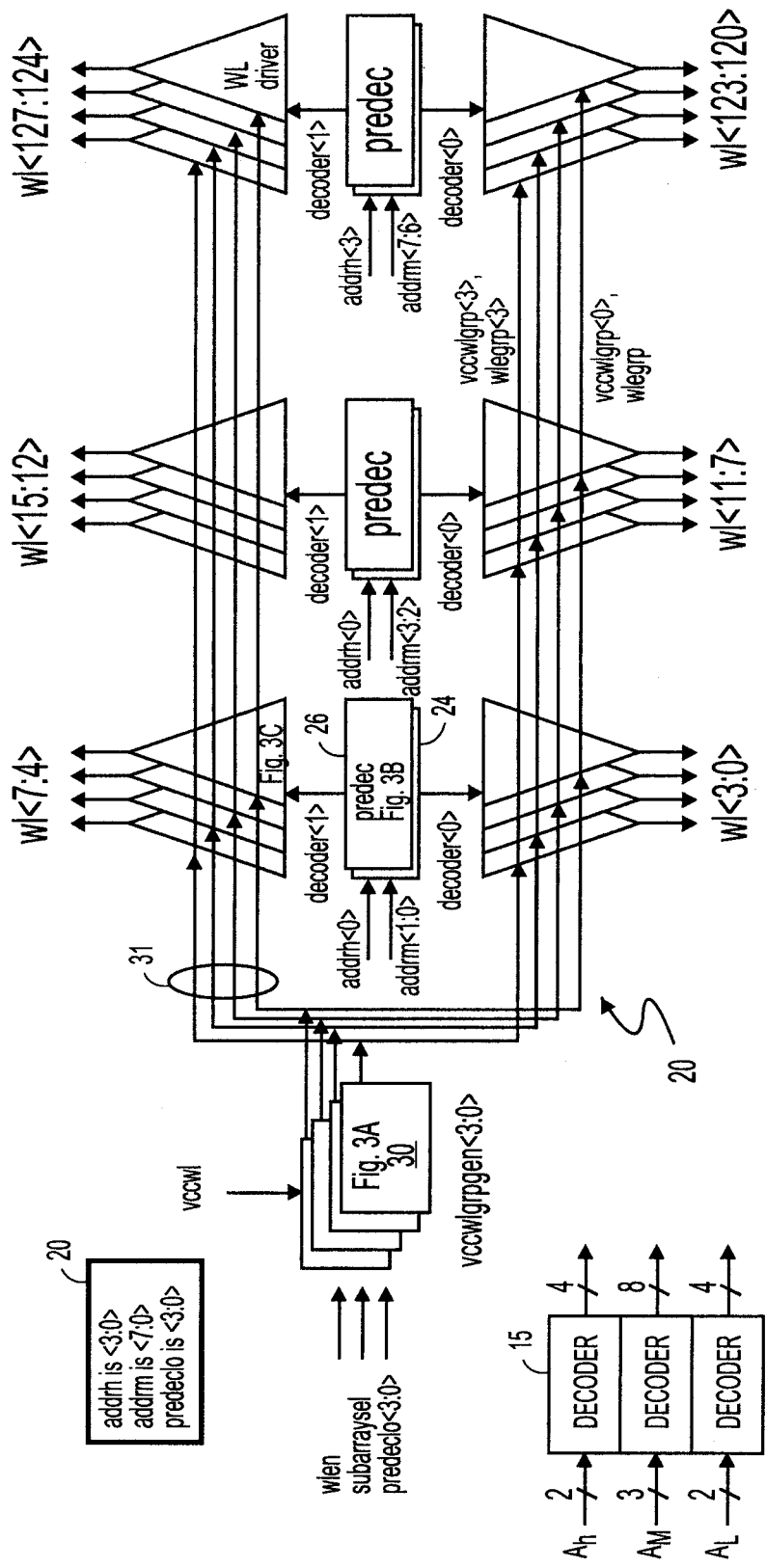
FIG. 2 is a diagram illustrating the grouping of word line drivers and the decoders used for selecting the word line drivers.

Architecture of FIG. 2

In the described embodiment, there are 128 WLs with the WL drivers organized in groups of four drivers, as shown in FIG. 2. Group 20, for instance, provides driver signals for WLs 124-127. The output of each of the drivers provides the waveform shown in FIG. 1B.

In the architecture of FIG. 2, the WLs are selected by seven of the address bits applied to the memory. These seven address bits are separated into two higher range address bits, three mid range address bits, and two low range address bits. These undecoded address bits are shown coupled to three decoders 15 in FIG. 2. The two high range address bits, after decoding, yield four decoded address bits shown in block 22 as a addrh<3:0>, the mid range address bits, after decoding, are shown in block 22 as addrm<7:0>, and finally, the decoded low range address bits are shown in block 22 as predeclo<3:0>. Thus to summarize, there are four decoded higher range address signals, eight mid-range decoded address signals and four lower level decoded address signals. These signals allow the selection of one of the 128 WLs (4×8×4=128).

In FIG. 2, the predecoders are organized in pairs such as predecoder 24 and predecoder 26, each of which selects four WL drivers. For example, the predecoder 26 selects the WL drivers for WLs 4-7 and the predecoder 24 selects the WL drivers for WLs 0-3. One of these decoders is shown in detail in FIG. 3B. Each decoder receives a decoded high range address signal and a decoded mid range address signal. The pair of decoders 24 and 26 receive addrh<0> and addrm<1:0>, every combination of the decoded high and mid range address signals are applied to one of the predecoders, consequently there are 32 predecoders organized as 16 pairs for this embodiment.

The decoded lower range address bits each select a circuit 30. Thus, there are four circuits 30, shown in detail in FIG. 3A. Circuits 30 receive a WL enable signal (wlen) and a subarray select signal. (In one embodiment, the memory is divided into a plurality of banks, and each bank has a plurality of subarrays.) Each of the circuits 30 provide two outputs, wlegrp and vccwlgrpen. Each of these outputs are provided to each of the WL drivers through the lines 31. Each of the vccwlgrpen signals from circuit 30 wakes up 32 WL drivers and, as will be seen in conjunction with FIG. 3C, provides the positive potential for the driving signal. As mentioned earlier, the decoded high and mid range addresses select four WL drivers. Finally, the wlegrp signal selects one of the four WL drivers, which driver is within the 32 drivers that are awake. Thus only a single word line driver actually provides a WL signal for any given set of addresses. By waking up only 32 of the 128 drivers considerable power is saved.

Figure 3A:
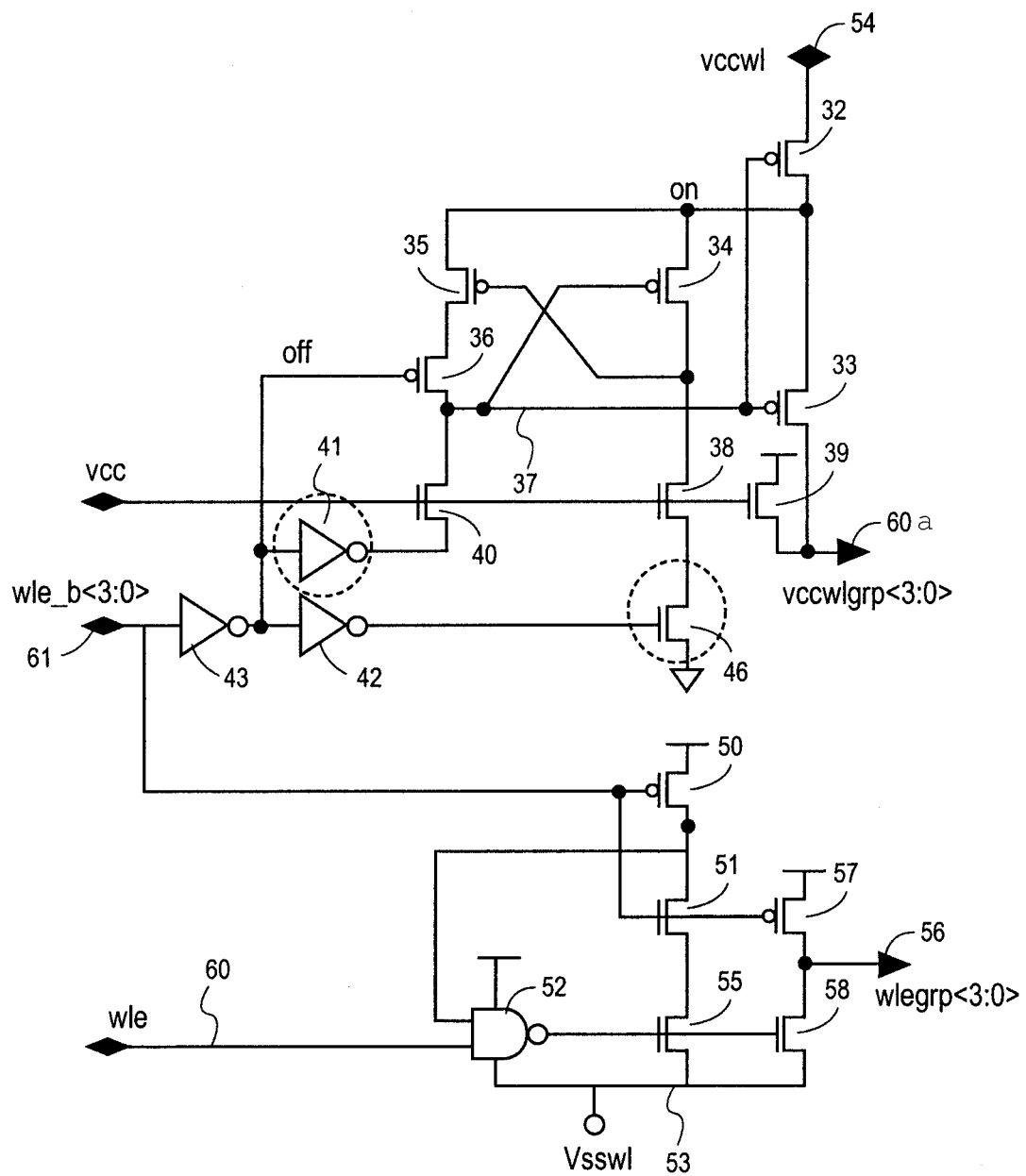
FIG. 3A is an electrical schematic of a circuit used for generating a group select signal.
Figure 3C:
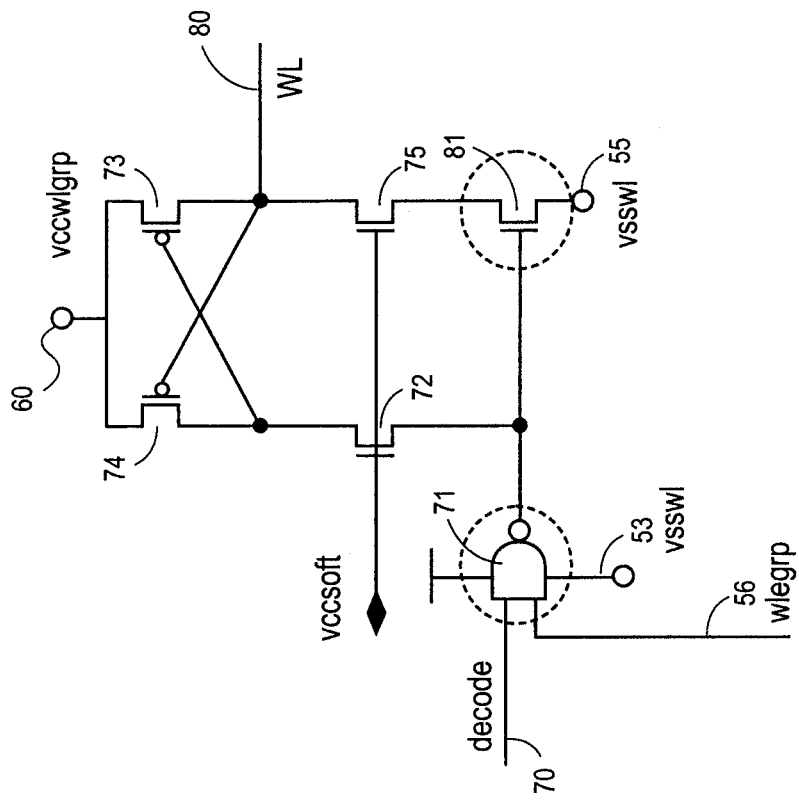
FIG. 3C is an electrical schematic of a word line driver which receives signals from the circuits of FIGS. 3A and 3B.

Referring now to FIG. 3A, the circuit receives the potential more positive than Vcc (VccWL) on line 54 from the on-chip charge pump which operates from Vcc. Also the circuit receives the negative potential on line 53 from the on-chip negative charge pump. Only one of the four circuits such as shown in FIG. 3A is selected at a time based upon the decoded low range address signal. This may be done by NANDing the wlen signal with predeclo<3:0> to provide the wle_b signal on line 61. Vcc is coupled to the gates of the transistors 38 and 40, and as will be discussed, these transistors provide protection against the higher voltage on line 54. The inverters 41, 42 and 43 are coupled between Vcc and ground, the NAND gate 52 receives the Vcc potential and is coupled to line 53 (the negative potential VssWL).

Line 54 is coupled to the output line 60a (Vccwlgrp) through the p-channel transistors 32 and 33. These transistors conduct when the potential on node 37 is low. In the latch-like circuit comprising p-channel transistors 34 and 35, the gate of the p-channel transistor 35 is also connected to node 37, thus transistor 35 conducts when transistors 32 and 33 are conducting and is off when the output of line 60 is in its sleep state (approximately equal to Vcc).

Assume that in the circuit of FIG. 3A wle_b is low, that is, the circuit has been selected by one of the decoded low range address signals. (wle is high during the entire process described below.) The output of the inverter 43 will be high, thus transistor 36 is off and the output of both inverters 41 and 42 will be low. Under these conditions, transistor 46 will not conduct and node 37 will be held low since transistor 40 is conducting. With node 37 low, transistors 32 and 33 conduct and line 60 rises to VccWL. Moreover, transistor 34 conducts, causing transistor 35 to be off.

Transistor 39 acts as a diode since its drain and gate are at the same potential (Vcc). This transistor prevents the line 60a from dropping to potential of more than one threshold voltage below Vcc. When the circuit of FIG. 3A is selected and the output line rises to VccWL, transistor 39 does not conduct since its source is at a higher potential than its gate and drain.

When the wle_b signal is in its high state, that is the circuit of FIG. 3A is deselected, the output of the inverter 43 is low, and this causes transistor 36 to conduct. The output of gate 41 is high and thus the node 37 is high. This prevents transistors 32 and 33 from conducting as well as transistor 34. On the other hand, transistor 35 is conducting as is transistor 46.

The transistors 38 and 40 provide protection from the higher voltage VccWL for transistor 46 and the inverter 41, respectively. When the circuit of FIG. 3A is selected transistor 46 is off, and the higher potential of VccWL would be on the transistor's drain but for transistor 38. At this time, transistor 38 is on since its gate is coupled to Vcc. It provides a threshold voltage drop so that transistor 46 is not subjected to the VccWL potential. Similarly, when the circuit of FIG. 3A is not selected, the output of inverter 41 would be exposed to the higher potential of VccWL but for transistor 40. The threshold voltage drop across transistor 40 consequently reduces the stress on the inverter 41.

The lower portion of FIG. 3A provides the wlegrp signal referenced to VssWL. The wle signal on line 60 provides one input to the NAND gate 52. The other input to this gate is from the node between the p-channel transistor 46 and the n-channel transistor 51. The output of gate 52 controls transistors 55 and 58. The node between transistors 57 and 58 provides the wlegrp signal. If the circuit of FIG. 3A is selected the potential on line 61 (wle_b) is low, causing transistors 50 and 57 to conduct and turning off transistor 51. That causes the junction between transistor 50 and 51 to rise and thus the conditions of gate 52 are met. The output of gate 52 will be low turning off transistor 58. Line 56 then is pulled to Vcc by transistor 57. When the circuit of FIG. 3A is deselected, wle_b is high, thus transistors 50 and 57 are off and transistor 51 conducts. The conditions of gate 52 are not met and its output is high, turning on transistors 55 and 58. This brings line 56 to VssWL.

Figure 3B:
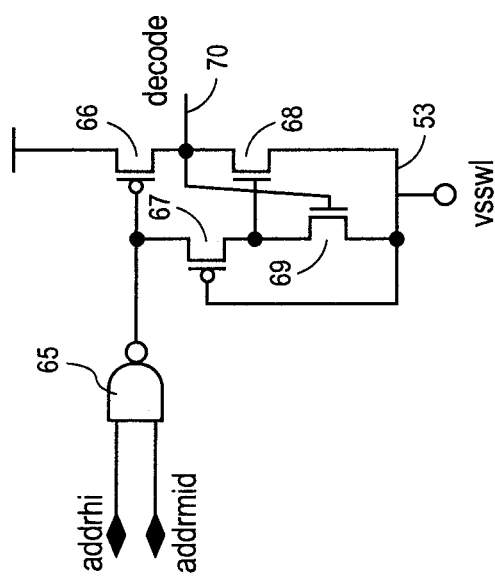
FIG. 3B is an electrical schematic of a level shifting decoder which receives decoded high and mid address ranges.

Decoder of FIG. 3B

The decoder of FIG. 3B receives one of the mid range and one of the high range decoded signals. If both of these are high, the conditions of the NAND gate 65 are met and the output of gate 65 drops in potential. This causes transistor 66 to conduct, causing line 66 to rise in potential to Vcc. Also, transistor 69 is conducting, causing transistor 68 to remain off. If the conditions of gate 65 are not met, transistor 66 is off, and transistor 67 conducts, causing transistor 68 to couple the line 70 to VssWL. Transistor 69 is off at this time. Thus, the decode signal on line 70 has an on potential of Vcc and off potential of VssWL. As mentioned earlier, there is one decoder for every four word line drivers, and accordingly line 70 is connected to four word line drivers.

Word Line Driver of FIG. 3C

The WL driver of FIG. 3C, if selected, receives a signal of magnitude Vcc on line 70 and line 56. This uniquely selects a WL driver. Moreover, the circuit of FIG. 3C, as well as 31 other WL drivers, receive the potential on line 60 to wake them up. With the conditions of gate 71 met, its output is low and transistor 73 conducts, causing the word line to rise to vccwlgrp. Transistor 74 is forced off and the n-channel transistor 81 is also off.

If the conditions of gate 71 are not met, transistor 81 conducts, and the gate of transistor 73 is at a high potential, disconnecting line 80 from Vccwlgrp. Transistor 74 conducts, reinforcing the off-state of transistor 73. Note that WL 80 is either at vccwlgrp (VccWL) when the WL is selected or is at VssWL (negative potential) when the WL driver of FIG. 3C is deselected. Once again, as was the case for the circuit of FIG. 3A the NAND gate 71 and transistor 81 would be subjected to the higher potential, one when the WL driver is selected and the other when the word line driver is deselected, however, transistors 72 and 75 prevent this from occurring, as was described in conjunction with FIG. 3A.

Figure 4:
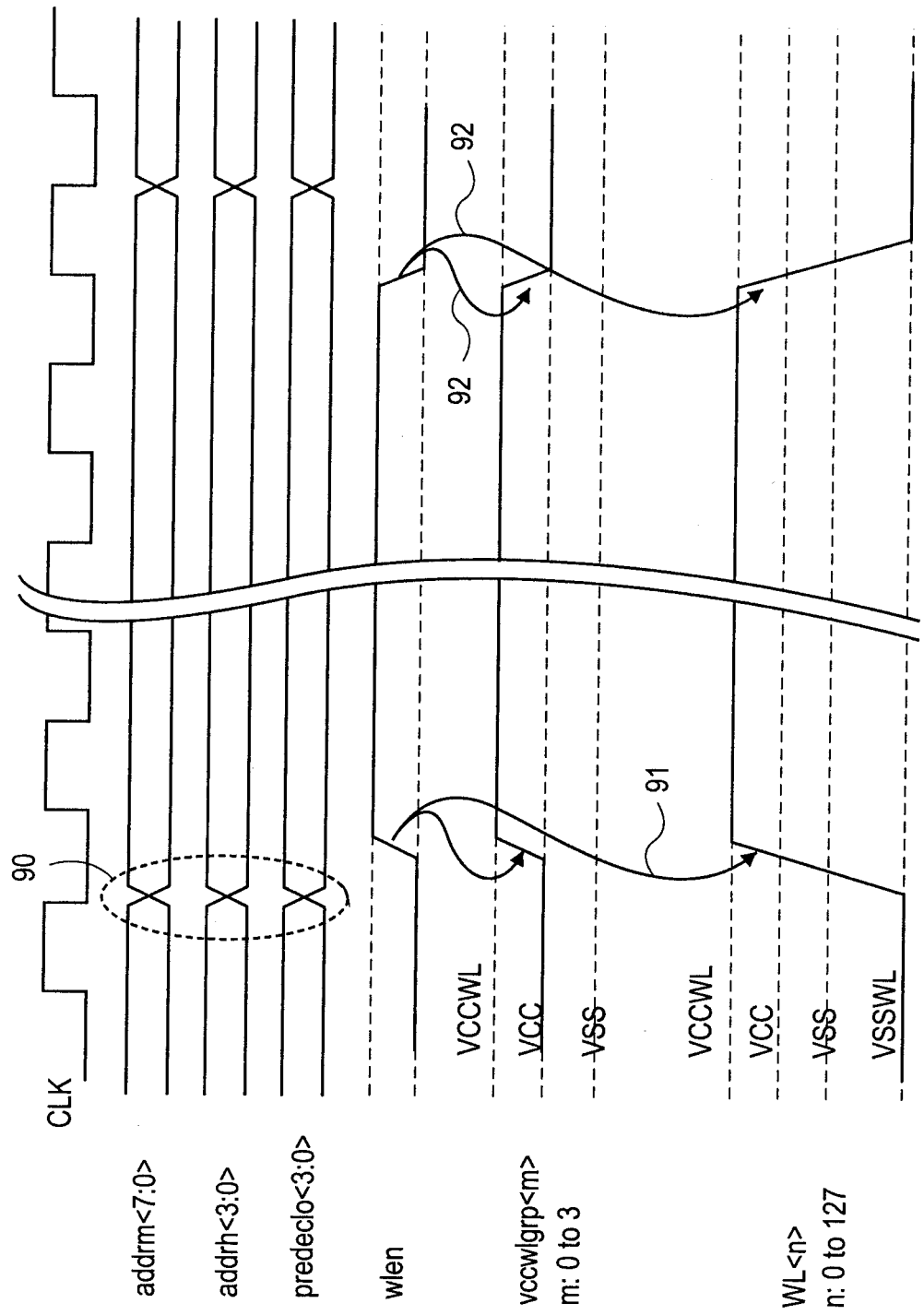
FIG. 4 is a timing diagram used to describe the operation of the circuits of FIGS. 3A-3C.

Timing Diagram of FIG. 4

The top waveform in FIG. 4 is the memory clock from which all the other timing signals are triggered. The dotted line 90 indicates that the address signals are applied to the address decoder 15 (FIG. 2) and are decoded. Shortly after that the wlen line (FIG. 3A) is selected. Then, the group signal (Vccwlgrp) is applied to the 32 WLs associated with one of the decoded low range address bits that selected the circuit of FIG. 3A. This potential is applied to line 60 of FIG. 3C. Note that before this time, this line is held at a voltage threshold below Vcc by transistor 39 of FIG. 3A. Following the rise of wlen as indicated by arrow 91, the WL driver signal for the selected WL rises from VssWL to VccWL.

After sensing has occurred the wlen potential drops, causing the wccwlgrp signal to drop to Vcc and for the WL to drop in potential to VssWL as shown by the arrows 92.

Thus, a WL selection architecture has been described which uses NAND logic and which provides a WL driver signal having a high potential higher than Vcc and lower potential negative with respect to Vss.

What is claimed is:
1. A DRAM, comprising:
 word line drivers;

a plurality of decoders each for selecting a group of the word line drivers from a plurality of groups of the word line drivers, the plurality of decoders receiving decoded address signals in a first and second range of memory addresses; and a plurality of selection circuits for receiving decoded address signals in a third different range of memory addresses, the plurality of selection circuits each providing a plurality of first selection signals, each coupled to the group of word line drivers of the plurality of groups of word line drivers, such that a single word line driver is selected for each unique decoded address in the first, second and third range of memory addresses.

2. The DRAM of claim 1, wherein the plurality of decoders employ NAND logic.

3. The DRAM of claim 1, wherein the word line drivers employ NAND logic for the selection of the single word line driver.

4. The DRAM of claim 1, wherein the DRAM operates from a single positive power supply of Vcc with respect to ground (Vss), and wherein non-selected word line drivers provide an output signal negative with respect to Vss.

5. The DRAM of claim 4, wherein the selected group of word line drivers provides an output signal more positive than Vcc.

6. The DRAM of claim 1, wherein the selection circuit, from the plurality of selection circuits, provides a second selection signal for each of the decoded address signals in the third range of address signals, for providing a positive potential higher than Vcc to a plurality of word line drivers, including the word line driver which is selected.

7. The DRAM of claim 5, wherein the selection circuit includes first transistors for protecting second transistors from exposure to the higher positive potential.

8. The DRAM of claim 5, wherein the word line drivers include transistors for protecting second transistors from exposure to the higher positive potential.

9. A DRAM, comprising:
word line drivers;
a plurality of decoders each employing a first NAND logic device for providing a first selection signal which selects a group of the word line drivers, each NAND logic device receiving a first decoded address signal derived from a first range of memory addresses and a second decoded address signal derived from a second range of memory addresses, different from the first range; and
each word line driver including a second NAND logic device such that only a single word line driver is selected, the second NAND logic device receiving one of the first selection signals and a second signal derived from decoded address signals in a third range of memory addresses, different than the first and second range of memory addresses.

10. The DRAM of claim 9, wherein the DRAM operates from a single positive potential Vcc with respect to ground (Vss), and wherein a selected word line driver provides an output signal more positive than Vcc.

11. The DRAM of claim 10, wherein non-selected word line drivers provide a negative signal with respect to Vss.

12. The DRAM of claim 9, wherein each word line driver includes transistors operating as protection devices to prevent application of potential more positive than Vcc to other transistors.

13. The DRAM of claim 9, including a circuit for selectively providing a potential more positive than Vcc to selected ones of the word line drivers, where the number selected is fewer than the total number of word line drivers.

14. A method for operating a DRAM from an applied positive potential of Vcc with respect to ground (Vss) comprising:
logically combining decoded high and mid range address signals to provide a first select signal referenced to a negative potential;
selecting a group of word line drivers with the first select signal;
generating a second select signal based on a decoded lower range of address signals; and
selecting one word line driver from the group of word line drivers.

15. The method of claim 14, including providing a word line driver signal from the selected word line driver which rises from the negative potential to a potential more positive than Vcc.

16. The method of claim 14, wherein the logically combining step uses NAND logic.

17. The method of claim 14, including using NAND logic for the selection of the one word line driver.

18. The method of claim 14, including generating third select signals which couple the more positive potential to a plurality of word line drivers, one of which includes the selected one word line driver.

19. The method of claim 14, including generating the more positive potential in the DRAM.

20. The method of claim 14, including generating the negative potential in the DRAM.

* * * * *